United States Patent [19]

Taguchi et al.

[11] Patent Number: 4,554,046
[45] Date of Patent: Nov. 19, 1985

[54] METHOD OF SELECTIVELY ETCHING HIGH IMPURITY CONCENTRATION SEMICONDUCTOR LAYER

[75] Inventors: Minoru Taguchi, Oomiya; Gen Sasaki, Yokohama, both of Japan

[73] Assignee: Kabushiki Kaisha Toshiba, Japan

[21] Appl. No.: 652,178

[22] Filed: Sep. 19, 1984

[30] Foreign Application Priority Data

Sep. 22, 1983 [JP] Japan .............................. 58-175367

[51] Int. Cl.$^4$ ...................... H01L 21/306; B44C 1/22; C03C 15/00; C03C 25/06
[52] U.S. Cl. .................................... 156/637; 29/571; 29/580; 148/187; 156/628; 156/657; 156/659.1; 156/662; 252/79.3; 252/79.4
[58] Field of Search ............ 156/628, 637, 657, 659.1, 156/662; 252/79.2, 79.4, 79.3, 142; 29/571, 580; 148/1.5, 187

[56] References Cited

U.S. PATENT DOCUMENTS

| 2,854,358 | 9/1958 | Schwartz | 156/662 X |
| 3,290,192 | 12/1966 | Kelley | 156/662 X |
| 4,372,803 | 2/1983 | Gigante | 156/637 |

FOREIGN PATENT DOCUMENTS 49-36792 10/1974 Japan .
49-45035 12/1974 Japan .

*Primary Examiner*—William A. Powell
*Attorney, Agent, or Firm*—Finnegan, Henderson, Farabow, Garrett & Dunner

[57] ABSTRACT

A method for selectively etching a high impurity concentration semiconductor layer by making use of a difference in impurity concentration is disclosed. According to this method, the high impurity concentration semiconductor layer is exposed to an aqueous solution of a hydrogen fluoride-nitric acid-acetic acid-based etching solution while being subjected to ultrasonic-vibration.

8 Claims, 20 Drawing Figures

METHOD OF SELECTIVELY ETCHING HIGH IMPURITY CONCENTRATION SEMICONDUCTOR LAYER

BACKGROUND OF THE INVENTION

1. Field of the Invention

The present invention relates to a method of selectively etching a high impurity concentration semiconductor layer which is provided directly or through a dielectric layer or another layer on a semiconductor substrate in a maufacturing process of a semiconductor device.

2. Description of the Prior Art

In the manufacture of semiconductor devices, a method is known wherein a high impurity concentration semiconductor layer which is provided directly or through a dielectric layer on a semiconductor substrate is selectively removed by an etching solution by utilizing an impurity concentration difference with another semiconductor layer. Such a method has been reported in, for example, Japanese Patent Publication No. 49-36792 and the like.

However, according to such a conventional method, when an element becomes large and micropatterned, uniformity of etching is degraded and a side-etching amount is increased. Particularly, since a temperature of an etching solution is gradually increased, an etching rate becomes different in correspondence with a increase in etching area, giving rise to a significant load effect (charge number dependency). In other words, nonuniformity of etching tends to occur. Since the etching solution has an isotropic property, an etching residue is formed unless over-etching is performed in consideration of irregularities in etching. Then, a side-etching amount becomes undesirably large.

SUMMARY OF THE INVENTION

The present invention has been made in consideration of the above situation, and has as its object to provide a method of selectively etching a high impurity concentration semiconductor layer wherein a loading effect is minimized, thereby controlling nonuniformity of etching and allowing micropatterning.

In order to achieve the above object of the present invention, there is provided a method of selectively etching a high impurity concentration semiconductor layer, comprising the step of:

Selectively removing a high impurity concentration semiconductor layer which is provided directly or through another layer on a semiconductor substrate by exposing the layer to an aqueous solution of a hydrogen fluoride-nitric acid-acetic acid etching solution while the layer is subjected to ultrasonic-vibration.

Note that, an etching solution to be used in the present invention, should preferably have a composition of hydrogen fluoride (HF):nitric acid ($HNO_3$):acetic acid ($CH_3COOH$), the ratio of which falls within a region defined by (1:10:10), (1:40:40), (1:10:40) and (1:40:10) by volume ratio, and the resultant solution is preferably diluted 1.5 to 5 times with water. In a conventional etching method comprising no ultrasonic-vibration step, an etching solution having such a composition ratio cannot provide a sufficient etching rate and cannot therefore be used in practice as an etching solution.

The ultrasonic resonant frequency used in the present invention is preferably 45 KHz or more (for example, up to 10 MHz).

An etching solution having the above range of composition ratio used in the present invention may contain iodine ions within the range of 0.1 to 0.5 g with respect to 1 l of the etching solution. This addition of iodine ions has the effect of improving etching uniformity.

A high impurity concentration semiconductor layer to be etched in the present invention has preferably an impurity concentration of $10^{19}/cm^3$ or more.

DETAILED DESCRIPTION OF THE PREFERRED EMBODIMENTS

Figure 1:
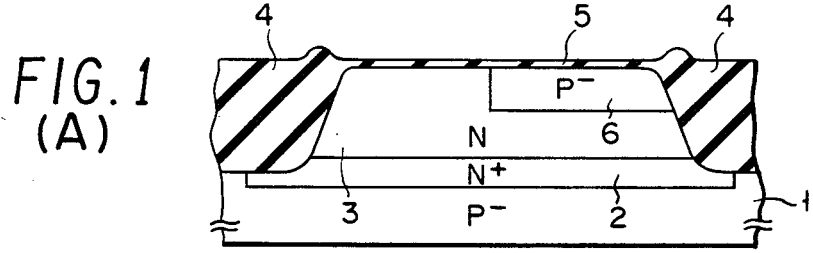
FIGS. 1(A) to 1(G) are respectively sectional views showing manufacturing steps of an integrated injection logic ($I^2L$) circuit according to an embodiment of the present invention.
Figure 1:
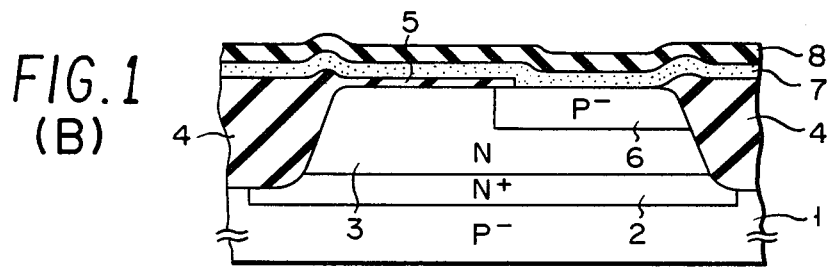
Figure 1:
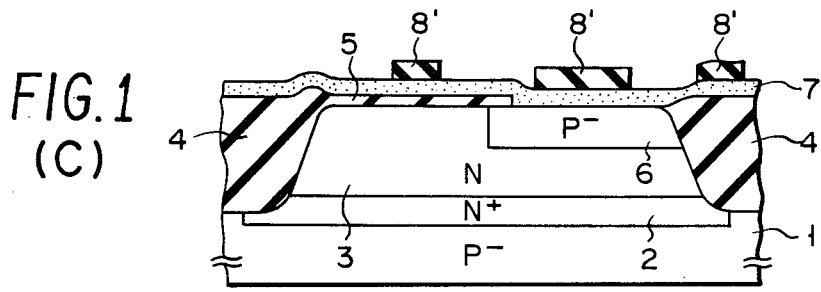
Figure 1:
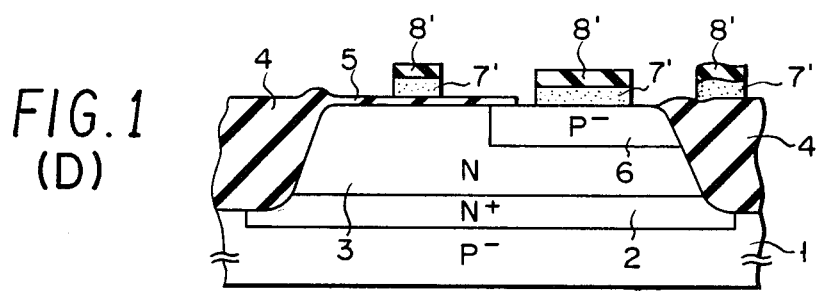
Figure 1:
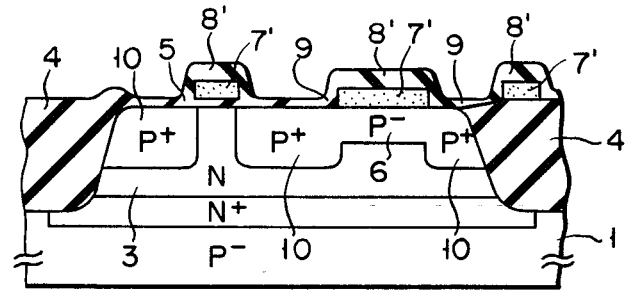
Figure 1:
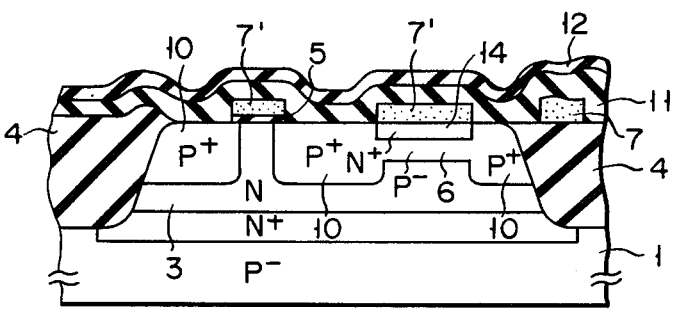
Figure 1:
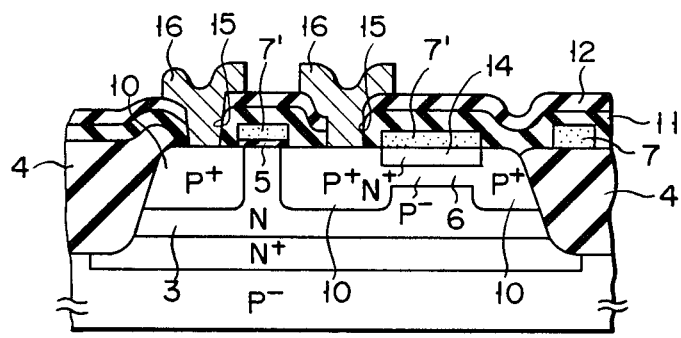

The present invention will be described by way of examples hereinafter.

EXAMPLE 1

In this example, a method of manufacturing an $I^2L$ circuit which adopts a method of the present invention will be described with reference to FIGS. 1A to 1G.

[I] An $n^+$-type buried layer 2 was formed by selectively diffusing antimony in a surface of, for example, a $p^-$-type Si substrate 1, and an n-type epitaxial layer 3 of a depth of about 1.5 μm was formed thereon. Thereafter, a field oxide film 4 was formed in a predetermined region. Then, an oxide film 5 having a thickness of 500 Å was formed by a thermal oxidizing treatment of an element region of the substrate 1. Thereafter, boron was ion-implanted in the oxide film 5 and the structure was annealed to form a $p^-$-type base layer 6 (FIG. 1(A)). Then, a portion of the oxide film 5 corresponding to a prospective emitter diffusion layer region was selectively removed. A polycrystalline silicon layer 7 to be a semiconductor layer having a high impurity concentration in an overall surface thereof was formed to have a thickness of 2,500 Å. Arsenic was ion-implanted in the silicon layer 7 at an acceleration voltage of 50 KeV, and a dose of $1 \times 10^{16}/cm^2$ to deposit an undoped CVD SiO$_2$ film 8 on an overall surface thereof. Thereafter, annealing was performed to uniformly diffuse arsenic ions in the silicon layer 7 (FIG. 1(B)). Furthermore, the undoped CVD SiO$_2$ film 8 was selectively removed using a resist pattern (not shown) as a mask, thereby forming a CVD SiO$_2$ film pattern 8' as a dielectric film pattern. Then, the resist pattern was removed (FIG. 1(C)).

[II] Next, the polycrystalline silicon layer 7 was selectively removed, using the CVD SiO$_2$ film pattern 8' as a mask, by a selective etching solution of HF:HNO$_3$:CH$_3$COOH (HAc):H$_2$O=1:20:20:50, while subjecting it to ultrasonic-vibration at a resonant frequency of 45 KHz so as to form a polycrystalline silicon layer pattern 7' (FIG. 1(D)). In this case, the N type epitaxial layer 3 and the oxide film 5 were substantially not etched. The pattern 7' is used as an emitter diffusion source, and as a wiring pattern on the field oxide film. Subsequently, the exposed base layer 6 was thermally oxidized to form an oxide film 9. Then, for example, boron was ion-implanted in the epitaxial layer 3 and the base layer 6 using the CVD SiO$_2$ film pattern 8' as a mask in a self-alignment manner and annealing was performed to form a p$^+$-type base layer 10 (FIG. 1(E)). Furthermore, after removing the CVD SiO$_2$ film pattern 8' and the oxide film 9, the resultant structure was thermally oxidized and a further undoped CVD SiO$_2$ film 11 was deposited thereon. In addition, an Si$_3$N$_4$ film 12 as a passivation film was deposited on the resultant structure. Thereafter, emitter diffusion was performed at a temperature of 1,000° C., thereby forming a shallow n$^+$-type emitter diffusion layer 14. Subsequently, respective portions of the Si$_3$N$_4$ film 12 and the undoped CVD SiO$_2$ film 11 corresponding to those of the base layer 10 were selectively etched to form contact holes 15, and thereafter Al wiring patterns 16 were formed thereon so as to form an I$^2$L circuit (FIG. 1(G)).

In this manner, according to the present invention, the polycrystalline silicon layer 7 containing arsenic ions at a high impurity concentration is selectively etched using the CVD SiO$_2$ film pattern (dielectric film pattern) 8' as a mask using the selective etching solution of HF:HNO$_3$:CH$_3$COOH:H$_2$O=1:20:20:50 and subjecting the polycrystalline silicon layer 7 to ultrasonic-vibration at a resonant frequency of, for example, 45 KHz, in the manner as shown in FIG. 1(C). For this reason, as shown in FIG. 1(D), it is possible to selectively etch only the polycrystalline silicon layer 7 without undesirably etching the base layer 6 and the epitaxial layer 3 so as to form the polycrystalline silicon pattern 7' in a self-alignment manner. Therefore, in comparison to the conventional method, a side-etching amount can be decreased, thereby minimizing a nonuniformity of etching and variations in size of the pattern of the polycrystalline silicon layer.

Figure 2:
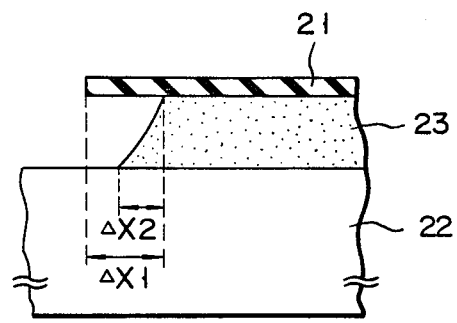
FIG. 2 is a sectional view of a semiconductor device for explaining a side-etching amount of a polycrystalline silicon layer according to the present invention.
Figure 3:
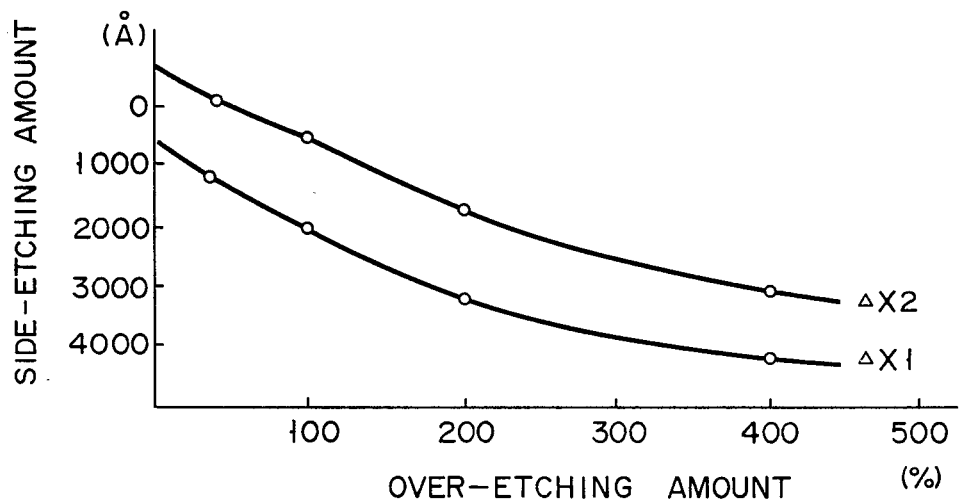
FIG. 3 is a graph showing a side-etching amount as a function of an over-etching amount in relation to FIG. 2.

In fact, as shown in FIG. 2, an n$^+$-type polycrystalline silicon layer (of an impurity concentration of up to $5 \times 10^{20}/cm^3$) of a thickness of 2,500 Å which was formed on an Si substrate 22 was etched using an Si$_3$N$_4$ film 21 as an etching mask. In this case, a side-etching amount of a polycrystalline silicon layer 23 with respect to an over-etching amount was as shown in FIG. 3. This etching was performed under the same conditions as those of the embodiment described above.

Figure 4:
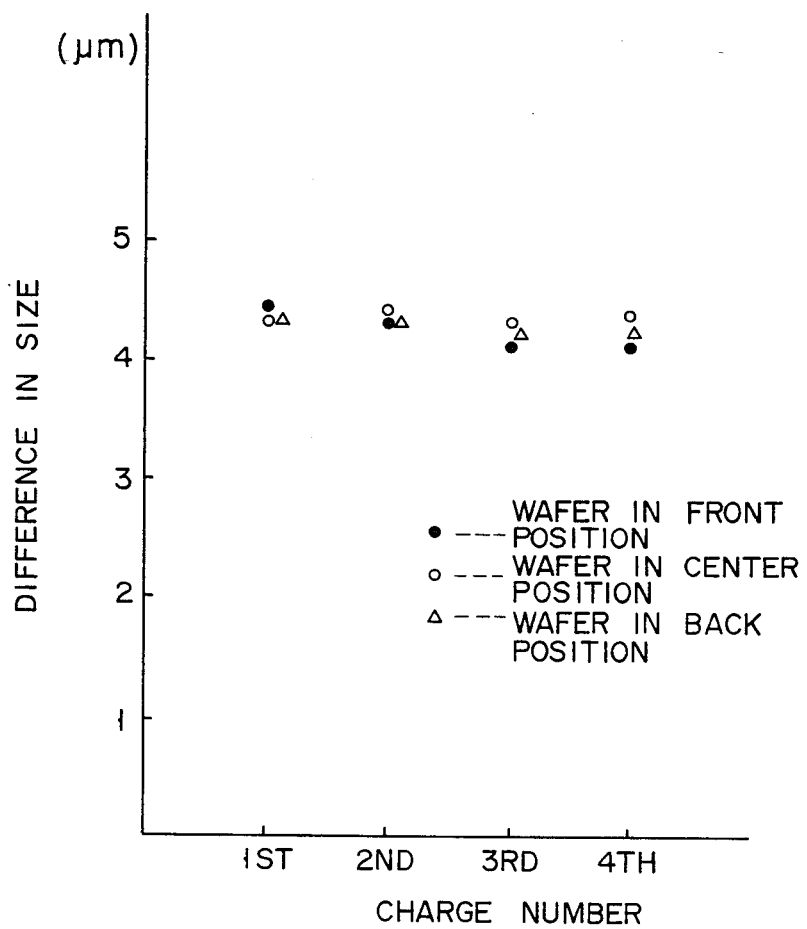
FIG. 4 is a graph for explaining size variation of the polycrystalline silicon layer according to the present invention.

As is apparent from FIG. 3, the side-etching amount $\Delta \times 1$ is considerably small such that it is 2,000 Å at 100% over-etching, and is 3,200 Å at 200% over-etching. In addition to this, it was found that an etching rate of the substrate 22 was 1/100 or less of that of the polycrystalline silicon layer 23, and an oxide film (not shown) on the substrate 22 had an etching rate of 1/20 or less of that of the layer 23. Although an impurity concentration of the polycrystalline silicon layer was set at up to $5 \times 10^{20}/cm^3$, in the etching method of this embodiment, the etching rate becomes fast when the impurity concentration becomes high, and, furthermore, the etching rate becomes slow when the concentration becomes low, in the same manner as a normal HF—HNO$_3$—HAc-based etching solution. Therefore, when the impurity concentration becomes 10$^{18}$/cm$^3$ or less, etching cannot be substantially performed. Furthermore, pattern size variations of the polycrystalline silicon layer in several charges were measured. As a result, the graph shown in FIG. 4 was obtained. In this case, etching was performed four times on twenty wafers (semiconductor substrates) per charge, and the size of the etched pattern was measured for three wafers, i.e., a first wafer (at a front position), a second wafer at a central position, and a third wafer at a back position. From FIG. 4, the etching method of the present invention was confirmed to be controllable with less variation than conventional ones.

As described above, since the polycrystalline silicon pattern 7' can be formed in a self-alignment manner, the base layer 10 can be formed with high controllability, as shown in FIG. 1(E). Furthermore, since this etching method uses a solution, unlike a dry etching method such as reactive ion etching, damage to a substrate and contamination with heavy metals can be avoided.

Figure 5:
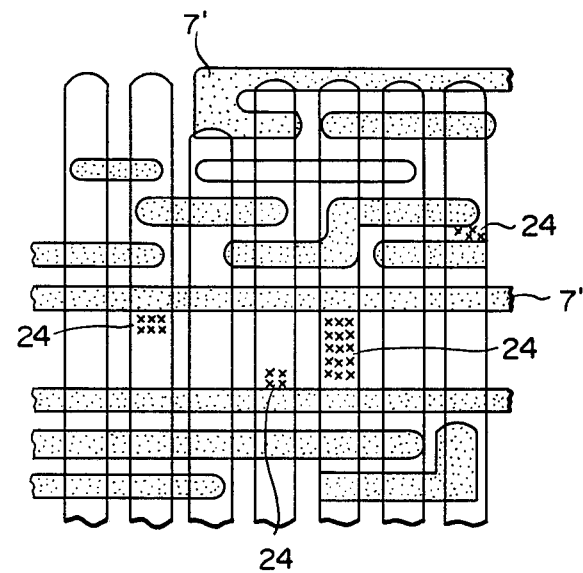
FIG. 5 is a schematic representation of a microphotograph of a semiconductor device obtained by a conventional etching method.
Figure 6:
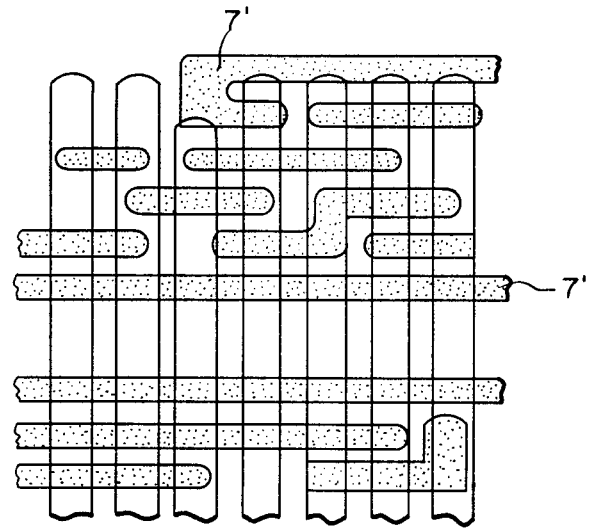
FIG. 6 is a schematic representation of a microphotograph of a semiconductor device obtained by an etching method of the present invention.
Figure 7:
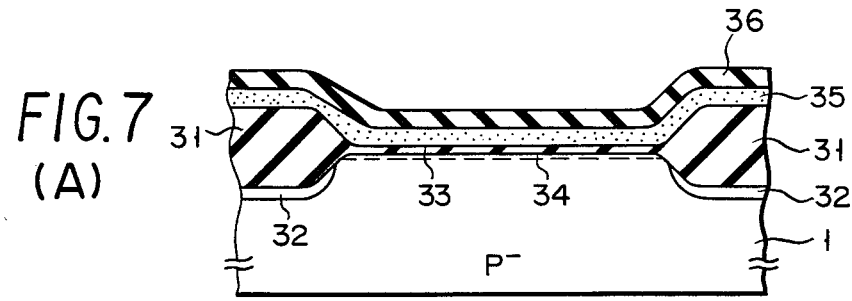
FIGS. 7(A) to 7(D) are respectively sectional views showing a method of manufacturing an n-channel MOS transistor according to another embodiment of the present invention.
Figure 7:
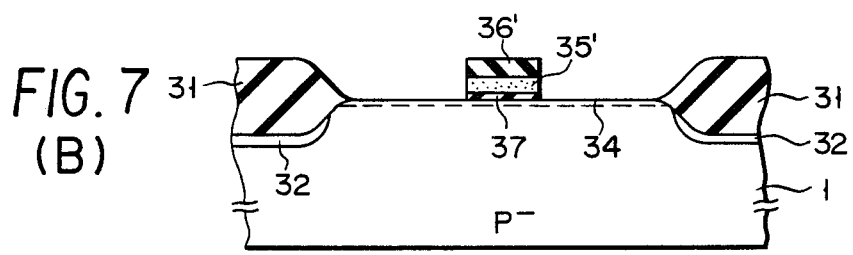
Figure 7:
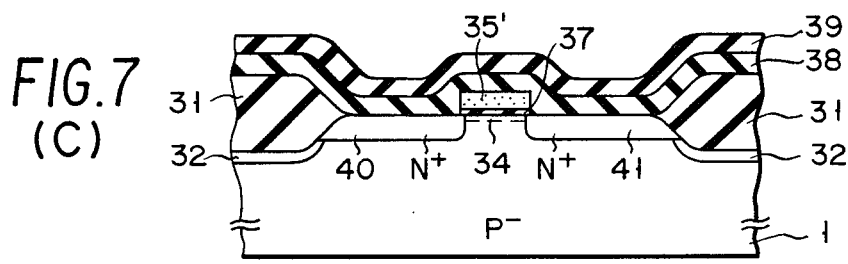
Figure 7:
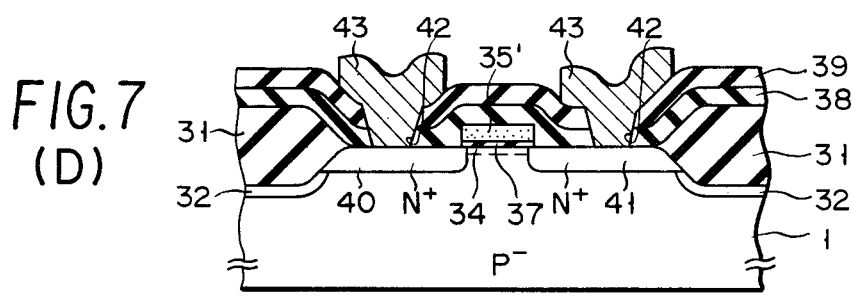

In the above embodiment, a case wherein the selective etching solution of HF:HNO$_3$:CH$_3$COOH:H$_2$O=1:20:20:50 was used is described. However, a polycrystalline silicon layer containing a high impurity concentration was also etched by employing above etching solution added with iodine and as a comparison by a conventional HF—HNO$_3$—HAc etching solution (HF:HNO$_3$:HAc=1:3:8). A plan view of each of the obtained semiconductor device was compared with each other, and the results shown in FIGS. 5 and 6 were obtained. Note that FIGS. 5 and 6 are schematic representations of microphotographs after a conventional etching method and an etching method of the present invention, respectively, and an etching solution in which 0.2 g of iodine ions were added per l of the solution was used. From these results, it is confirmed that, in the conventional method, as shown in FIG. 5, a residue 24 of the polycrystalline silicon pattern 7' being etched still remains at a stepped portion and a pattern edge. On the other hand, in the method using a selective etching solution according to the present invention, as shown in FIG. 6, the residue 24 can be completely removed and the polycrystalline silicon pattern 7' having good precision can be obtained without performing over-etching and with less pattern conversion difference.

EXAMPLE 2

In this Example, a method of manufacturing an n-channel MOS transistor which employs that of the present invention will be described with reference to FIGS. 7A to 7D.

[I] A field oxide film 31 was formed on a p$^-$-type Si substrate 1 by a conventional technique, and a p-type channel stopper region 32 was formed under the oxide film 31. Then, a thin and pure oxide film 33 was formed on island regions of the substrate 1 surrounded by the channel stopper region 32. Thereafter, boron was ion-implanted so as to control a threshold voltage ($V_{TH}$), thereby forming an ion-implantation layer 34. A polycrystalline silicon layer 35 which had a thickness of 3,500 Å and contained an impurity at a high concentration of up to $10^{21}/cm^3$, and an undoped CVD $SiO_2$ film 36 as a dielectric film were sequentially deposited on an entire surface of the resultant structure (FIG. 7(A)). Furthermore, the undoped CVD $SiO_2$ film 36 was patterned, thereby forming an undoped CVD $SiO_2$ film pattern 36' as a dielectric film pattern. Thereafter, the polycrystalline silicon layer 35 was etched under the same conditions as in Example 1 using the undoped CVD $SiO_2$ film pattern 36' as a mask so as to form a polycrystalline silicon pattern (gate electrode) 35'. Then, the exposed oxide film in an element region was selectively removed using an ammonium fluoride solution (a mixture of HF+HN$_4$F), thereby forming a gate insulation film 37 (FIG. 7(B)).

[II] Next, after removing the undopsed CVD $SiO_2$ film pattern 36', for example, arsenic was ion-implanted in an exposed surface of the substrate 1 using the gate electrode 35' as a mask. Then, the exposed substrate 1 was thermally oxidized and an undoped CVD $SiO_2$ film 38 was deposited thereon. Then, after the resultant structure was subjected to $POCl_3$ gettering treatment, a boron-phospho silicate glass (BPSG) film 39 was deposited on the undoped CVD $SiO_2$ film 38. In order to prevent poor step coverage, the BPSG film 39 was melted and so flattened, and arsenic was ion-implanted in the substrate 1 and annealing was performed so as to form n+-type source and drain regions 40 and 41 (FIg. 7(C)). Furthermore, respective portions of the BPSG film 39 and the undoped CVD $SiO_2$ film 38 corresponding to portions of the source and the drain regions 40 and 41 were selectively removed to form contact holes 42. Thereafter, Al wiring patterns 43 were formed to form an n-channel MOS transistor (FIG. 7(D)).

In this manner, according to the above example, for the same reason as that of Example 1, the gate electrode 35 having less size variation and good controllability could be formed and the source and drain regions 40 and 41 could be formed in a self-alignment manner.

In the above example, a case wherein a polycrystalline silicon layer having a high impurity concentration is etched is described. However, this method is not limited to this. For example, this method can be employed in the case wherein a diffusion layer having a high impurity concentration formed in a surface layer of an Si substrate is etched.

In the above example, a resonant frequency of the ultrasonic wave is set at 45 KHz. However, this method is not limited to this. The resonant frequency can be 45 KHz or more. In fact, the present inventors measured a resultant wafer when the resonant frequency was 28 KHz. In this case, the side-etching amount became twice or more that at the resonant frequency of 45 KHz. However, it was confirmed that when the resonant frequency was 45 KHz or more, the side-etching amount was small.

In the above example, the case wherein a composition of the etching solution was set to be HF:HNO$_3$:HAc:H$_2$O=1:20:20:50 was described, but this method is not limited to this. In other words, any solution which has a composition ratio in the region defined by ratios (1:10:10), (1:40:40), (1:10:40), and (1:40:10) which is diluted 1.5 to 5 times with water can be adopted.

FIGS. 8 to 11 show etching performances when an arsenic implanted polycrystalline silicon layer 7 is selectively etched as in Example 1, by using etching solutions as shown in the Table below.

TABLE

| Example | (Composition of Etching Solution) | | | | |
|---|---|---|---|---|---|
| | HF | HNO$_3$ | CH$_3$COOH | H$_2$O | I$_2$ |
| Ex. 3 | 1 | 10 | 10 | 25 | 0.1 g/l |
| Ex. 4 | 1 | 30 | 30 | 65 | 0.1 g/l |

Figure 8:
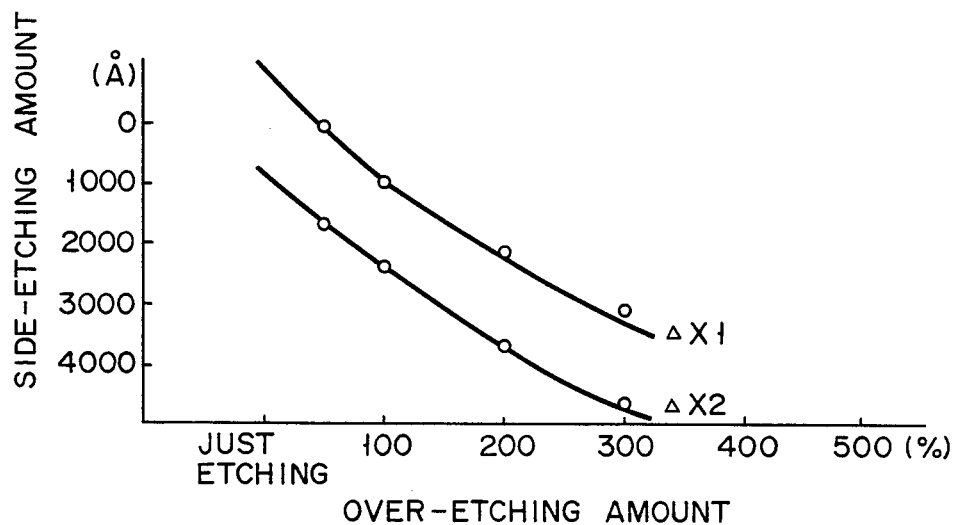
FIGS. 8 and 10 are graphs showing respectively a side-etching amount of a polysilicon layer as a function of an over-etching amount.
Figure 9:
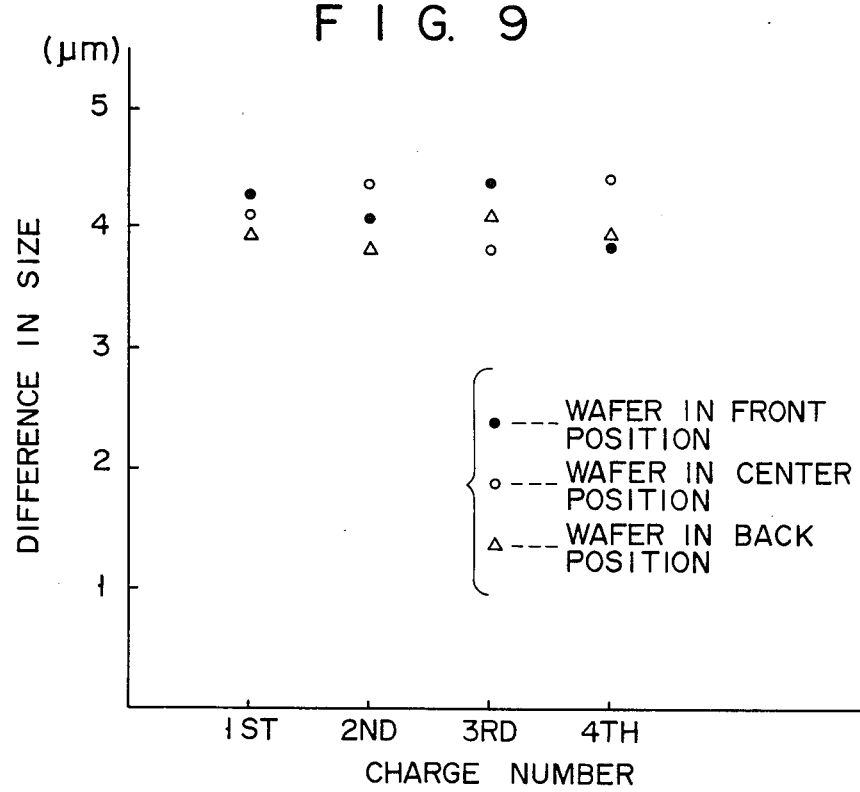
FIGS. 9 and 11 are graphs for explaining respectively size variation of a polycrystalline silicon layer according to another embodiment of the present invention.

FIGS. 8 and 9 (Example 3) show data on side-etching amounts and size variations respectively, where a selective etching solution consisting HF:HNO$_3$:CH$_3$COOH:H$_2$O (1:10:10:25 by volume) and containing 0.1 g of iodine per liter of the etching solution was employed for etching the polycrystalline silicon layer 7 (of an impurity concentration of up to $5 \times 10^{20}/cm^3$) with an accompaniment of ultrasonic-vibration at a resonant frequency of 48 KHz. The data show that, as compared with the etching solution consisting of HF:HNO$_3$:CH$_3$COOH:H$_2$O=1:20:20:50 employed in Example 1, the amount of side-etching in relative to the amount of over-etching as well as the size variations are slightly increased. These results are seemed to be caused by the increase of the etching velocity and the rise in temperature of the etching solution.

Figure 10:
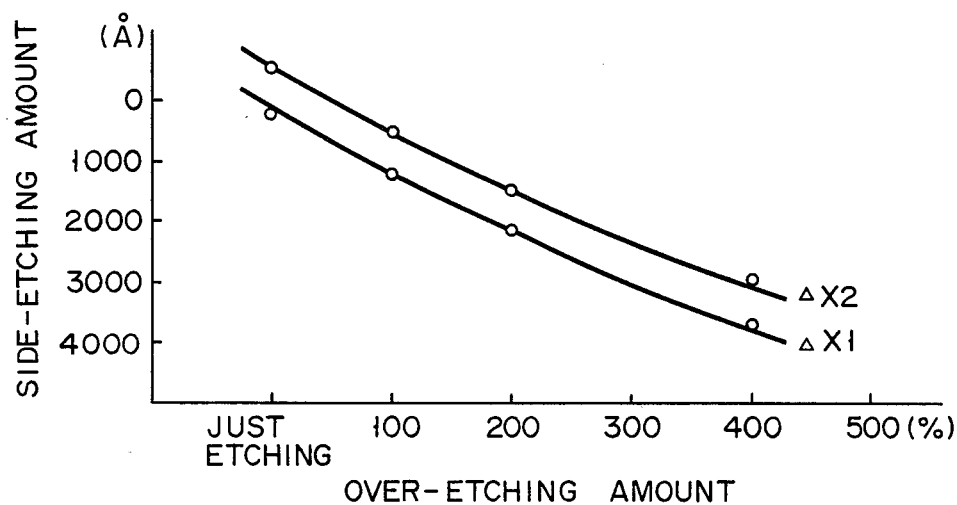
Figure 11:
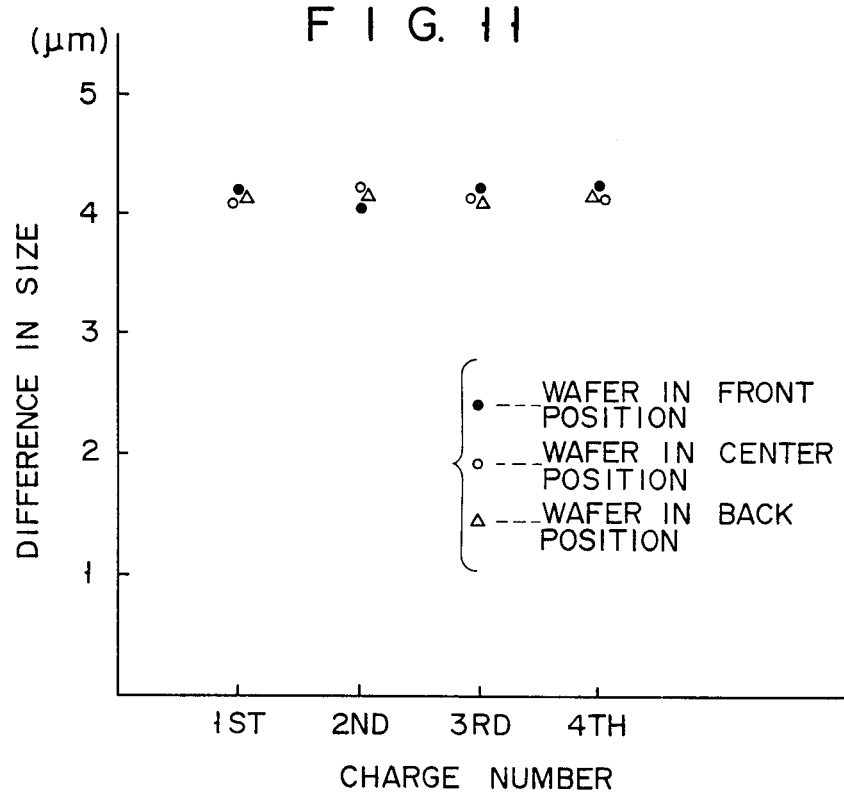

FIGS. 10 and 11 (Example 4) show data on side-etching amounts in relative to over-etching amounts and size variations respectively, where a selective etching solution consisting HF:HNO$_3$:CH$_3$COOH:H$_2$O (1:30:30:65 by volume) and containing 0.1 g of iodine per liter of the etching solution was employed for etching the polycrystalline silicon layer 7 (of an impurity concentration of up to $1 \times 10^{21}/cm^3$) with an accompaniment of ultrasonic-vibration at a resonant frequency of 48 KHz.

It should be noticed that the etching performance of Example 4 is comparable with that of Example 1.

Based upon these experimental results, the following was confirmed. Generally, a decrease in ratio of water in the etching solution will invite increase in etching velocity and vice versa. On the other hand, an increase in impurity concentration will promote the etching velocity. When the concentration of HNO$_3$ or HAc is increased, variations in etching performance and selectivity (in comparison to a semiconductor layer having a low impurity concentration) are decreased. Alternatively, when the concentration of the HNO$_3$ or HAc is decreased, even a semiconductor layer having a high impurity concentration cannot be etched. If the level of dilution by water is lowered, variation in etching is increased, thereby preventing size control.

Accordingly, an optimum etching performance can be attained by suitably selecting the composition of the etching solution within the range of this invention in conformity with the impurity concentration of a polycrystalline silicon layer.

Furthermore, in Examples 1 and 2, the cases wherein the method of the present invention was employed in manufacturing an I$^2$L and an n-channel MOS transistor were described. However, this method is not limited to these embodiments. This method can be widely employed in the manufacture of both bipolar and field-effect transistors.

As described above, according to the present invention, a method of manufacturing a semiconductor device can be provided in which a semiconductor layer having a high impurity concentration can be patterned in a self-alignment manner without nonuniformity of etching and without deteriorating another semiconductor layer.

What is claimed is:

1. A method for selectively etching a high impurity concentration semiconductor layer, comprising the step of:

selectively removing a high impurity concentration semiconductor layer which is provided directly or through another layer on a semiconductor substrate by exposing the layer to an aqueous solution of a hydrogen fluoride-nitric acid-acetic acid-based etching solution while the layer is subjected to ultrasonic-vibration.

2. A method according to claim 1, wherein a composition ratio of hydrogen fluoride-nitric acid-acetic acid-based solution falls within a region defined by ratios (1:10:10), (1:40:40), (1:10:40) and (1:40:40) by volume ratio, and this solution mixture is diluted 1.5 to 5 times to provide a selective etching solution.

3. A method according to claim 1, wherein said selective etching solution contains 0.1 to 0.5 g of iodine per l thereof.

4. A method according to claim 1, wherein said high impurity concentration semiconductor layer is selectively etched using a low impurity concentration semiconductor film pattern as a mask.

5. A method according to claim 4, wherein said high impurity concentration semiconductor layer has an impurity concentration of not less than $10^{19}/cm^3$, and said low impurity concentration semiconductor film pattern has an impurity concentration of not more than $10^{18}/cm^3$.

6. A method according to claim 1, wherein said high impurity concentration semiconductor layer is selectively etched using a dielectric film pattern as a mask.

7. A method according to claim 1, wherein said high impurity concentration semiconductor layer has an impurity concentration of not less than $10^{19}/cm^3$.

8. A method according to claim 1, wherein ultrasonic vibration is performed at a resonant frequency of not lower than 45 kHz.

* * * * *